United States Patent [19]

Sasaki

[11] Patent Number: 5,182,561
[45] Date of Patent: Jan. 26, 1993

[54] INTEGRATED CONVERTER WITH GATE FOR SUPPLYING INTEGRATING DOCK PULSES TO COUNTERS ONLY DURING REFERENCE SIGNAL INTEGRATING PERIOD

[75] Inventor: Tadao Sasaki, Kanagawa, Japan

[73] Assignee: Sony Corporation, Japan

[21] Appl. No.: 704,049

[22] Filed: May 22, 1991

[30] Foreign Application Priority Data

May 31, 1990 [JP] Japan .................................. 2-142523

[51] Int. Cl.⁵ .............................................. H03M 1/50
[52] U.S. Cl. .................................... 341/166; 341/127
[58] Field of Search ............... 341/126, 127, 128, 164, 341/166, 167, 168

[56] References Cited
U.S. PATENT DOCUMENTS

| 3,588,877 | 6/1971 | Keefe .............................. 341/166 X |
| 4,023,160 | 5/1977 | Kirschner ........................ 341/167 X |
| 4,110,746 | 8/1978 | Furakawa et al. ............... 341/166 X |
| 4,521,763 | 6/1985 | Muraro et al. ....................... 341/157 |
| 4,661,803 | 4/1987 | Nishiyama et al. ................ 341/166 |

OTHER PUBLICATIONS

Millman, Microelectronics Digital and Analog Circuits and Systems, 1979 McGraw-Hill pp. 613–615.

Primary Examiner—Howard L. Williams
Attorney, Agent, or Firm—Ronald P. Kananen

[57] ABSTRACT

An integrated A/D converter includes an integrator 8integrating reference signals in synchronism with an integration start signal, and counters for counting integrating clock pulses until the integrated value of the integrator reaches a value corresponding to an input signal, thereby to convert the input signal into a digital or analog signal based on the counts of the counters. An AND gate supplies the integrating clock pulses to the counters only during a predetermined period in synchronism with the integration start signal, so that the integrating clock pulses are supplied to the counters only during an integrating period for the reference signals.

7 Claims, 6 Drawing Sheets

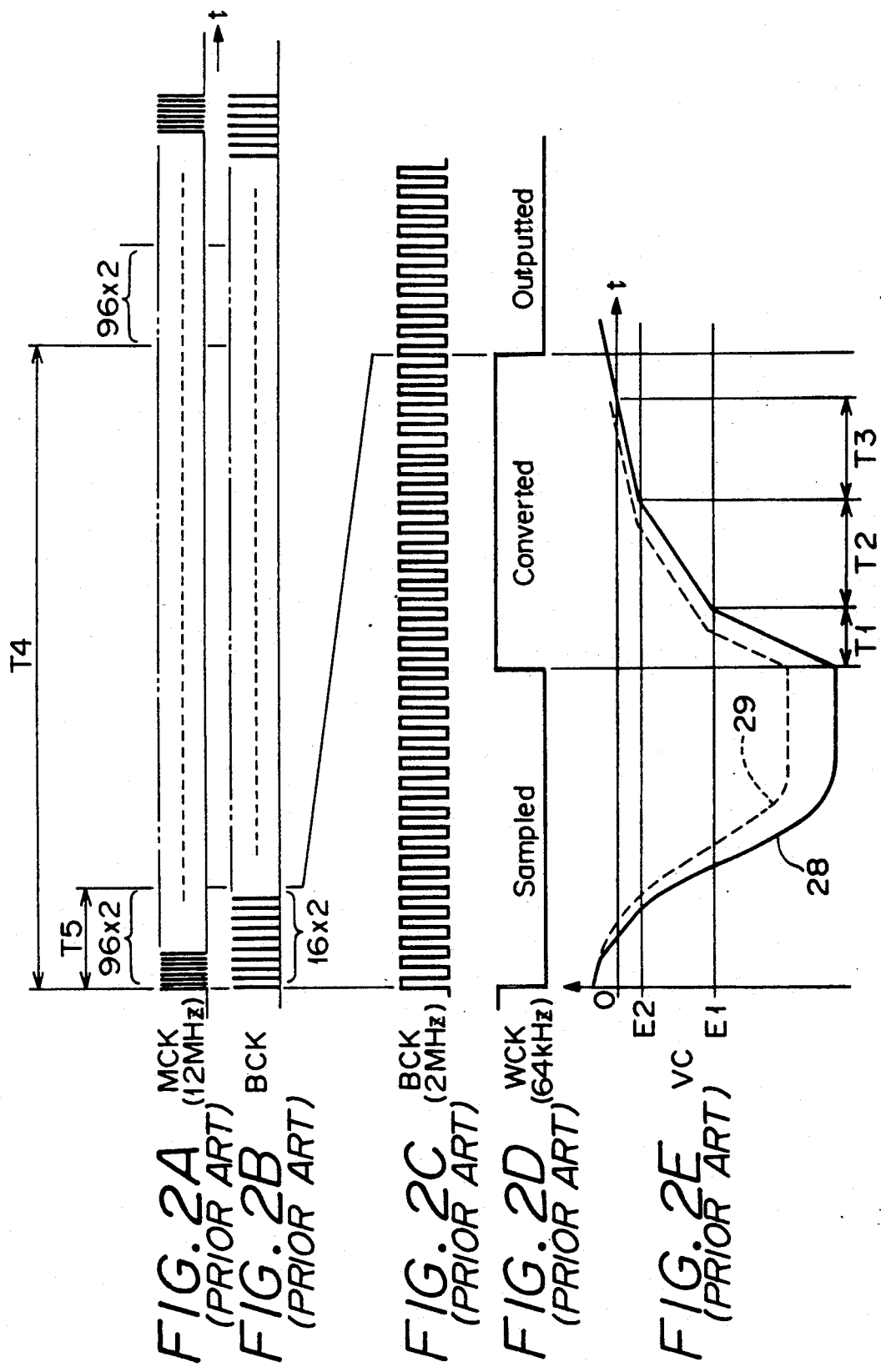
FIG. 2A (PRIOR ART) MCK (12MHz)
FIG. 2B (PRIOR ART) BCK
FIG. 2C (PRIOR ART) BCK (2MHz)
FIG. 2D (PRIOR ART) WCK (64kHz)
FIG. 2E (PRIOR ART) VC

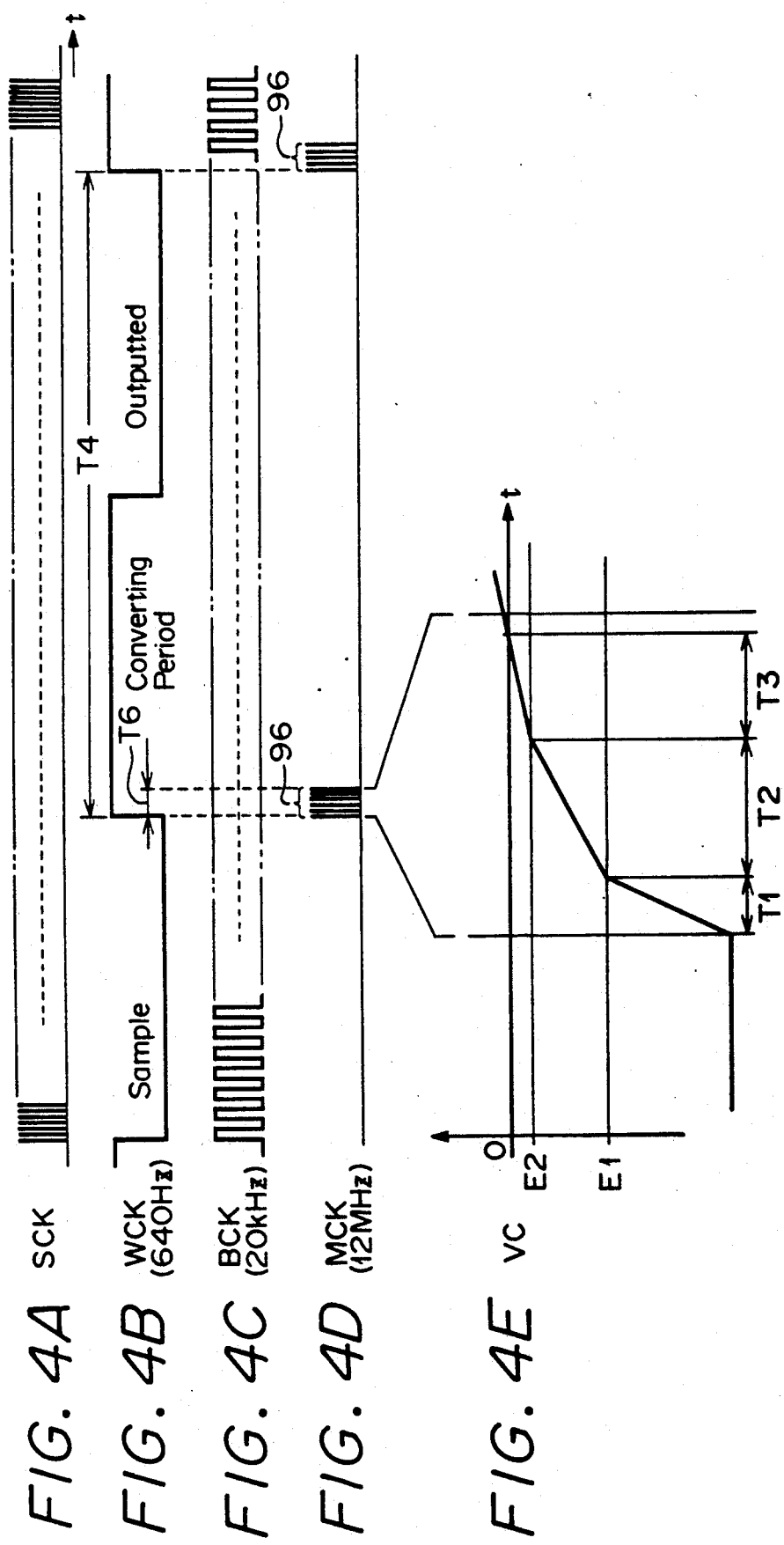

INTEGRATED CONVERTER WITH GATE FOR SUPPLYING INTEGRATING DOCK PULSES TO COUNTERS ONLY DURING REFERENCE SIGNAL INTEGRATING PERIOD

BACKGROUND OF THE INVENTION

1. Field of the Invention

The present invention relates to an integrated converter for use as an integrated analog-to-digital converter or an integrated digital-to-analog converter.

2. Description of the Prior Art

Analog-to-digital (A/D) converters include an integrated A/D converter, a successive approximation A/D converter, and a parallel approximation A/D converter. The integrated A/D converter among others (see Japanese Laid-Open Patent Publication No. 60-79811, for example) is capable of converting signals with high accuracy, as with the integrated digital-to-analog (D/A) converter.

FIGS. 1A and 1B of the accompanying drawings show a conventional three-stage cascade integrated A/D converter for converting audio input signals in a frequency range of about 20 kHz. The integrated A/D converter shown in FIGS. 1A and 1B has an A/D converter unit 1 constructed as an integrated circuit (IC). An analog input signal VI supplied through a input terminal 2 to the A/D converter unit 1 is converted into a serial digital signal DS which is outputted from an output terminal 3. The A/D converter unit 1 is supplied with an integrating clock signal MCK, an output clock signal BCK, and an integration start signal WCK through respective terminals 4, 5, 6.

A system clock signal SCK having a frequency of 12 MHz (more accurately, 12.288 MHz) is supplied to an input terminal 7. The frequency of the system clock signal SCK is divided by a frequency divider 8 into a 1/6 frequency, which is then divided by a frequency divider 9 into a 1/32 frequency. The system clock signal SCK is transmitted through a buffer 10A as the integrating clock signal MCK (see FIG. 2A). The output signal from the frequency divider 8 is transmitted through a buffer 10B as the output clock signal BCK (see FIGS. 2B and 2C) which has a frequency of about 2 MHz. The output signal from the frequency divider 9 is transmitted through a buffer 10C as the integration start signal WCK (see FIG. 4D) which has a frequency of 64 kHz.

In the A/D converter unit 1, the input signal VI is supplied to an inverting input terminal of a differential amplifier 14 through a resistor 11 and a first input terminal and an output terminal of a switch circuit 13. The first input terminal of the switch circuit 13 is connected to the output terminal of the differential amplifier 14 through a resistor 12 which has the same resistance as that of the resistor 11. The inverting input terminal of the differential amplifier 14 is connected to the output terminal thereof through an integrating capacitor 15. The differential amplifier 14 has a noninverting input terminal connected to ground. The switch circuit 13 also has second, third, and fourth input terminals supplied with respective reference signals VR1, VR2, VR3 through respective resistors 16, 17, 18. If the input signal VI is of a positive voltage, then the reference signals VR1, VR2, VR3 are of negative voltages. With the resistors 16, 17, 18 being of equal resistances, since $2^5 = 32$, the following equations are satisfied:

$$VR1 = 32 \times VR2, \quad VR2 = 32 \times VR3.$$

A converted output signal VC produced from the differential amplifier 14 is supplied to inverting input terminals of comparators 19, 20, 21 whose noninverting input terminals are supplied with reference signals having a voltage level E1, a voltage level E2, and a ground level, respectively. Output signals from the respective comparators 19, 20, 21 and the integrating clock signal MCK are supplied to a clock signal selector 22. The voltage levels E1, E2 are of negative voltages, respectively. If the level difference between an input voltage and a 1-bit output voltage is expressed as ΔE, then the following equations are satisfied:

$$E1 = 32 \times E2, \quad E2 = 32 \times \Delta E.$$

The clock signal selector 22 supplies the integrating clock signal MCK to a high-order counter 23 when the output signals from the comparators 19, 20, 21 are of a high level of "1", to an intermediate-order counter 24 when only the output signals from the comparators 20, 21 are of a high level of "1", and to a low-order counter 25 when only the output signal from the comparator 21 is of a high level of "1". Each of the counters 23, 24, 25 comprises a 5-bit binary counter. Output count signals from the counters 23, 24, 25 correspond respectively to high-order five bits, intermediate-order five bits, and low-order five bits, of a converted 15-bit output signal. These parallel output count signals from the counters 23, 24, 25 and the output clock signal BCK are supplied to a shift register 26. The shift register 26 supplies its output signal as the serial digital signal DS to the output terminal 3 in synchronism with the output clock signal BCK.

The A/D converter unit 1 also includes a control circuit 27 which is supplied with the integrating clock signal MCK and the integration start signal WCK. The control circuit 27 is also supplied with a signal indicative of the address of the counter 23, 24, or 25 which is being supplied with the integrating clock signal MCK, from the clock signal selector 22. When the integration start signal WCK is of a low level of "0", the control circuit 27 controls the switch circuit 13 to select the first input terminal to integrate the input signal VI. When the integration start signal WCK is of a high level of "1", the control circuit 27 controls the switch circuit 13 to select one of the reference signals VR1, VR2, VR3 depending on the selection by the clock signal selector 22 of the counter 23, 24, or 25. Immediately after the integration start signal WCK goes high, the control circuit 27 clears the counts of the counters 23, 24, 25 through a line (not shown). Immediately after the integration start signal WCK goes low, the control circuit 27 loads the parallel data into the shift register 26.

Operation of the conventional integrated A/D converter shown in FIGS. 1A and 1B will be described below with reference to FIGS. 2A through 2E. FIGS. 2C through 2E show signal waveforms in a period T5 (FIG. 2A) corresponding to 96×2 pulses of the integrating clock signal MCK. The integration start signal WCK is obtained by dividing the frequency of the integrating clock signal MCK by 6×32, and the period T5 of the integrating clock signal MCK is equivalent to the period of the integration start signal WCK.

During an interval in which the signal WCK is of a level of "0" in the period T5, the switch circuit 13 selects the input signal VI. Since the capacitor 15 is quickly charged with a current of the signal VI, the converted output signal VC from the differential amplifier 14 becomes a signal which is opposite in polarity and equal in magnitude to the signal VI, as indicated by the solid-line curve 28 in FIG. 2E. Therefore, the input signal VI is sampled during this interval. When the signal WCK thereafter goes high, the control circuit 27 clears the counts of the counters 23, 24, 25, and then causes the switch circuit 13 to select any one of the reference signals VR1, VR2, VR3 depending on the address information from the clock signal selector 22.

More specifically, as shown in FIG. 2E, during an interval T1 in which the converted output signal VC is lower than the level E1, the switch circuit 13 selects the reference signal VR1, and the high-order counter 23 is supplied with the integrating clock signal MCK. While the reference signal VR1 is being integrated by the capacitor 15 (i.e., discharged thereby in the illustrated arrangement), pulses of the clock signal MCK are counted by the high-order counter 23. During an interval T2 in which the converted output signal VC is of a level between the levels E1, E2, the reference signal VR2 and the intermediate-order counter 24 are selected. During an interval T3 in which the converted output signal VC is of a level between the level E2 and the ground level 0, the reference signal VR3 and the low-order counter 25 are selected. The integrated value produced by the capacitor 15 as the converted output signal VC becomes zero, the low-order counter 25 stops counting the pulses. Therefore, a binary code composed of a serial combination of the 5-bit output signals from the counters 23, 24, 25 serves as the digitally converted data of the input signal VI. Stated otherwise, according to the three-stage integrating arrangement shown in FIG. 1, since $2^5=32$ and $3 \times 32=96$ for 15-bit digital conversion, only 96 pulses are required to be used as the integrating clock signal MCK. If 15-bit digital conversion were to be effected by one-stage integration, however, since $2^{15}=32768$, 32678 pulses are required for use as the integrating clock signal MCK.

When the integration start signal WCK becomes "0", the control circuit 27 loads the 15-bit data into the shift register 26, and enables the switch circuit 13 to select the input signal VI again. The shift register 26 supplies the 15-bit data serially to the output terminal 3 in synchronism with the output clock signal BCK, and at the same time the input signal VI starts being sampled.

If the A/D converter is used to convert an ordinary audio signal, then another integrator comprising a differential amplifier 14 is connected parallel to the existing differential amplifier 14, for integrating a right channel input signal, the existing differential amplifier 14 integrating a left channel input signal, which may be the input signal VI. While the integration start signal WCK is being of a level of "1", the right channel input signal is sampled, and while the integration start signal WCK is being of a level of "0", the right channel input signal is converted into a digital signal. The shift register 26 alternately supplies the left channel 15-bit data and the right channel 15-bit data to the output terminal 3. In this manner, two-channel input signals are successively converted into digital signals at 64 kHz.

When the input signal VI is reduced in amplitude, the sampled converted output signal VC is of a waveform as indicated by the broken-line curve 29 in FIG. 2E, and the integrated voltage gradients during analog-to-digital conversion are the same as those when the input signal VI is higher in amplitude.

Recently, research has been carried out to incorporate in portable battery-operated electrocardiographs A/D converters for converting analog bioelectric signals, such as electrocardiographic signals, into digital signals for digital signal processing. The A/D converters for such medical applications are supplied with input signals whose frequencies range from 0 to 100 Hz, and are required to have a minimum electric power requirement. If A/D converters for audio signal processing use can be used as A/D converters for medical use, then it will be possible to lower the cost of developing and manufacturing electrocardiographs.

ICs of the CMOS configuration consume electric energy at positive- or negative-going edges of pulses, and hence their electric energy consumption generally increases in proportion to the frequencies of various clock signals used in the ICs. Therefore, inasmuch as the frequencies of input signals such as bioelectric signals are about 1/100 of audio frequencies, when the frequencies of the integrating clock signal MCK, the output clock signal BCK, and the integration start signal WCK in the A/D converter shown in FIGS. 1A and 1B are reduced to 1/100, the electric power consumption by the A/D converter unit 1 as it is used in medical applications may be reduced to 1/100 of the electric power consumption for audio signal processing applications.

When the frequency of the integrating clock signal MCK in FIGS. 1A and 1B is to be reduced to 1/100, it is necessary to reduce the integrated voltage gradients to 1/100 (the time constant is increased 100 times) in the periods T1 through T3 shown in FIG. 2E. However, if the time constant is increased 100 times, the capacitance of the integrating capacitor 15 is too large or the integrating current is too small, resulting in unstable operation. Conversely, if the integrated voltage gradients were too small, then it would be difficult to determine the end of an integration process through zero-crossing detection of the converted output voltage VC, with the results that a conversion error would be increased and the tendency to induce noise would also be increased.

In order to set a sampling frequency for the input signal VI in the A/D converter shown in FIGS. 1A and 1B to 640 Hz, for example, for bioelectric signals, it may be desirable to sample and convert the input signal VI once during the period T5 (1/T5 = 64 kHz) as is the case with the conventional arrangement, and to introduce the finally produced 15-bit digital signal in a period T4 (T4 = 100 T5). However, though the sampling frequency for the input signal is reduced to 1/100, the electric power consumption cannot be reduced since it remains the same as that of the conventional A/D converter.

OBJECTS AND SUMMARY OF THE INVENTION

It is an object of the present invention to provide an integrated converter which is capable of effecting stable conversion from analog to digital signals or vice versa and consumes a reduced amount of electric energy when the integrated converter operates at a conversion rate that is lower than the original conversion rate originally designed for the integrated converter.

According to the present invention, there is provided an integrated converter comprising integrating means for integrating reference signals in synchronism with an integration start signal, counting means for counting integrating clock pulses until the integrated value of the integrating means reaches a value corresponding to an input signal, thereby to convert the input signal into a digital or analog signal based on the count of the counting means, and a gate for gating the integrating clock pulses to supply the integrating clock pulses to the counting mean only during a predetermined period in synchronism with the integration start signal, so that the integrating clock pulses are supplied to the counting means only during an integrating period for the reference signals.

The gate comprises an AND gate having first and second input terminals, the first input terminal being supplied with the integrating clock pulses, further including a counter for applying a high-level signal to the second input terminal of the AND gate while the count of the counter is lower than a predetermined value.

The integrated converter may typically be used as an integrated analog-to-digital converter or an integrated digital-to-analog converter.

Only during the integrating period for the reference signals, the integrating clock pulses are supplied as a burst of pulses to the counting means. Since no integrating clock pulses are supplied to the counting means in an interval except the integrating period, the electric power consumption due to the integrating clock pulses is reduced. The frequency at which the input signal is converted is lowered by lowering only the integration start signal but not lowering the frequency of the integrating clock pulses. In this manner, the electric power consumption due to the integrating clock pulses is greatly reduced.

The above and other objects, features, and advantages of the present invention will become apparent from the following detailed description of an illustrative embodiment thereof to be read in conjunction with the accompanying drawings, in which like reference numerals represent the same or similar objects.

BRIEF DESCRIPTION OF THE DRAWINGS

FIGS. 2A through 2E are timing charts showing signals produced in the conventional integrated converter shown in FIGS. 1A and 1B;

FIGS. 4A through 4E are timing charts showing signals produced in the integrated converter shown in FIGS. 3A and 3B.

DETAILED DESCRIPTION OF THE PREFERRED EMBODIMENT

Figure 3A:
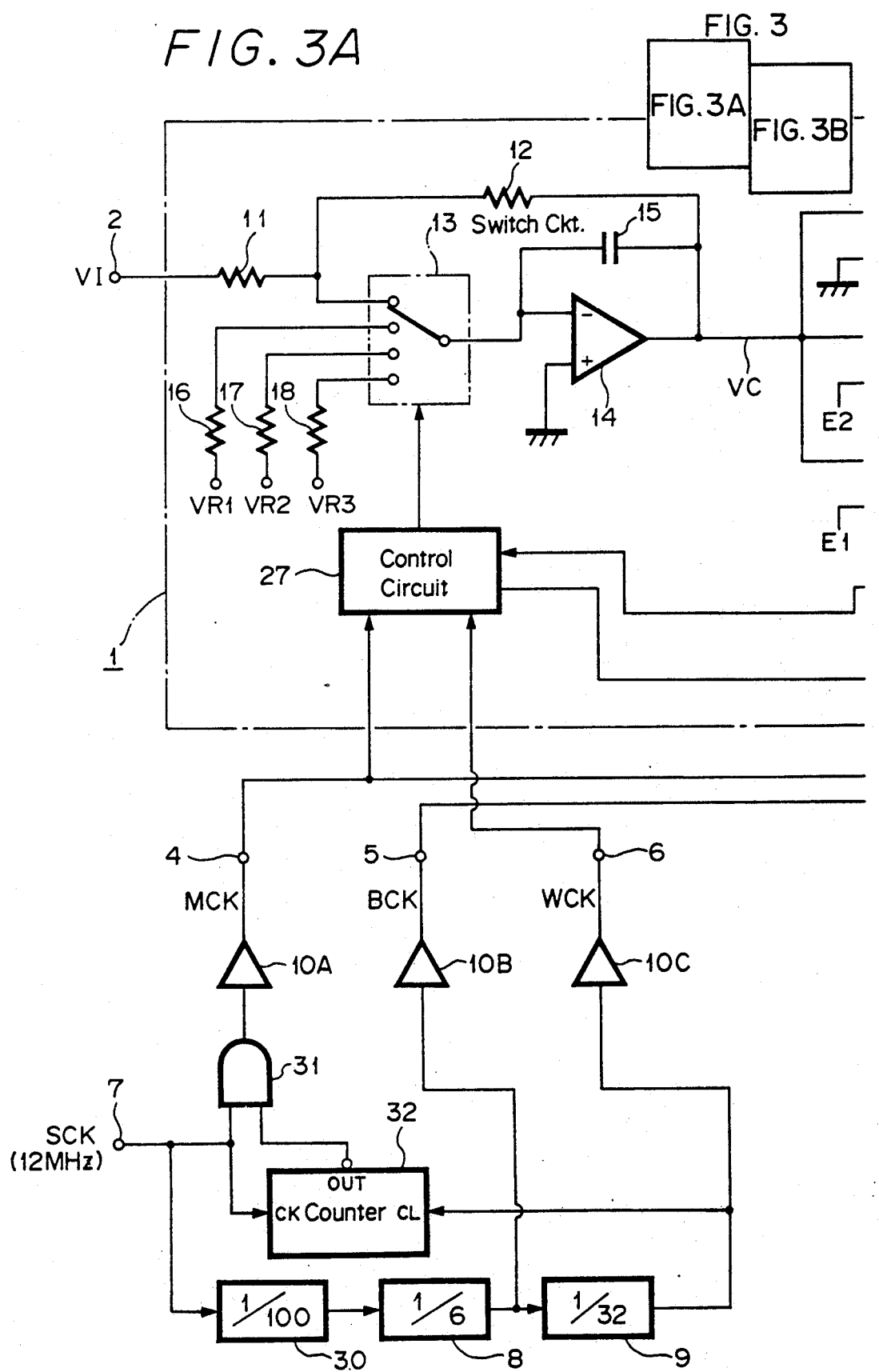
FIGS. 3A and 3B are block diagrams of an integrated converter according to the present invention.
Figure 3B:
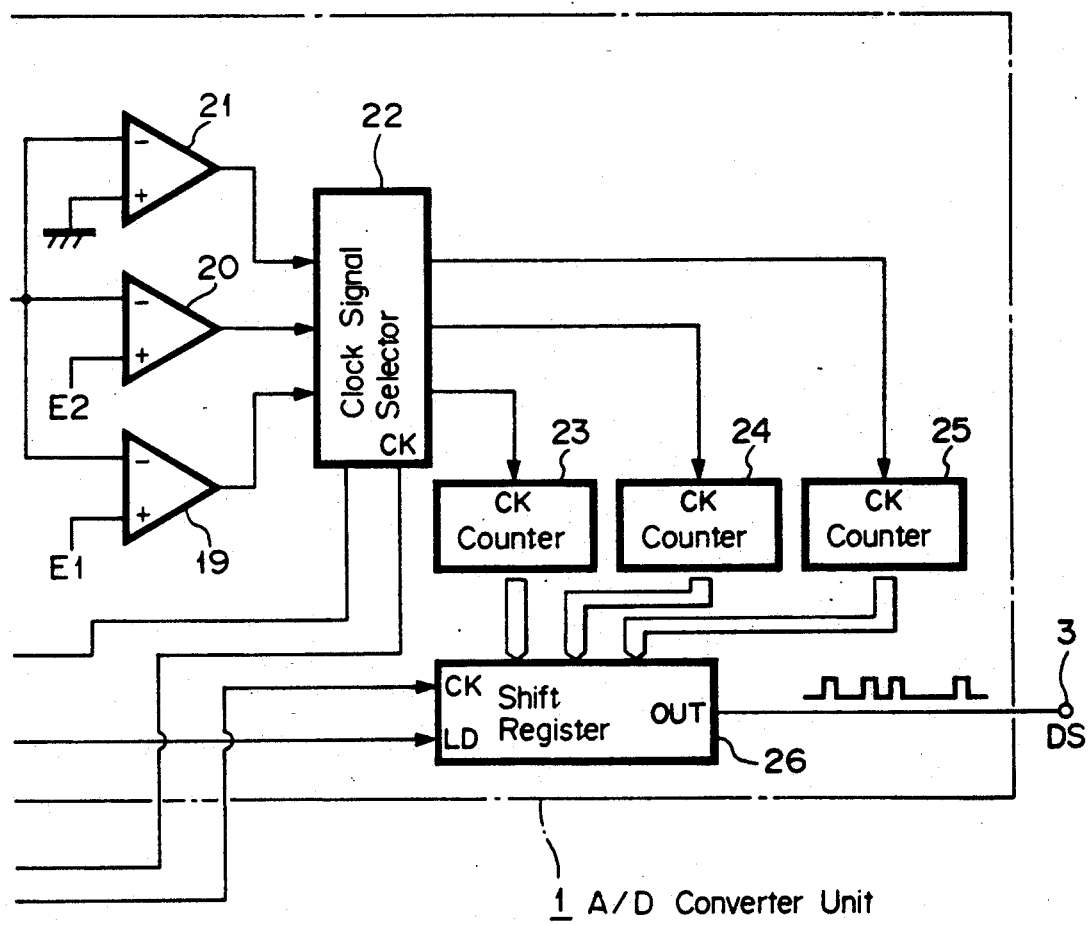

FIGS. 3A and 3B show an integrated converter according to the present invention. The integrated converter shown in FIGS. 3A and 3B is in the form of an analog-to-digital (AD) converter which is originally designed for converting audio signals into digital signals at a conversion frequency of 64 kHz, but modified for conversion at a frequency of 640 Hz, so that it may be used as an A/D converter in an electrocardiograph or the like which handles low-frequency bioelectric signals.

Figure 1A:
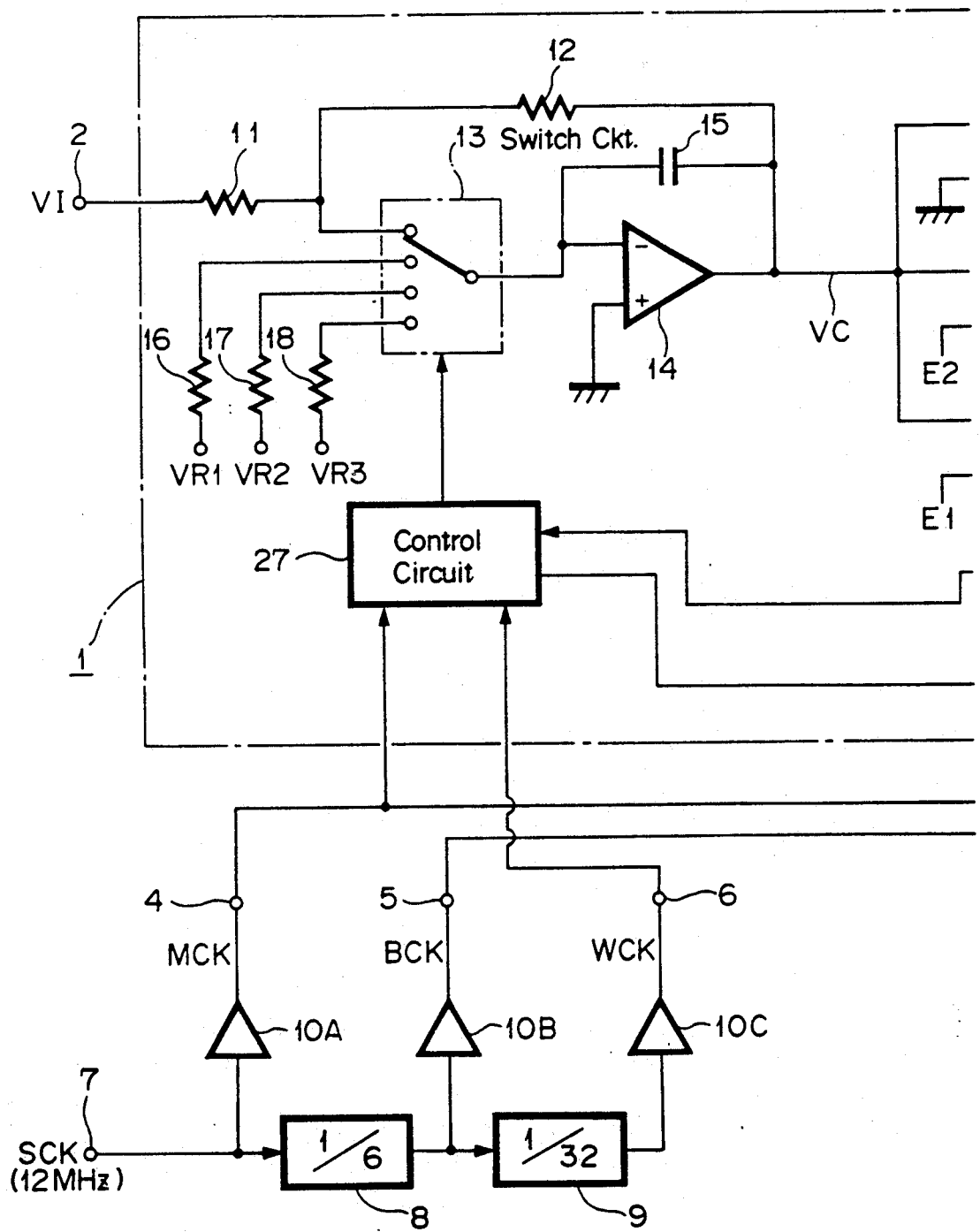
FIGS. 1A and 1B are block diagrams of a conventional integrated converter.
Figure 1B:
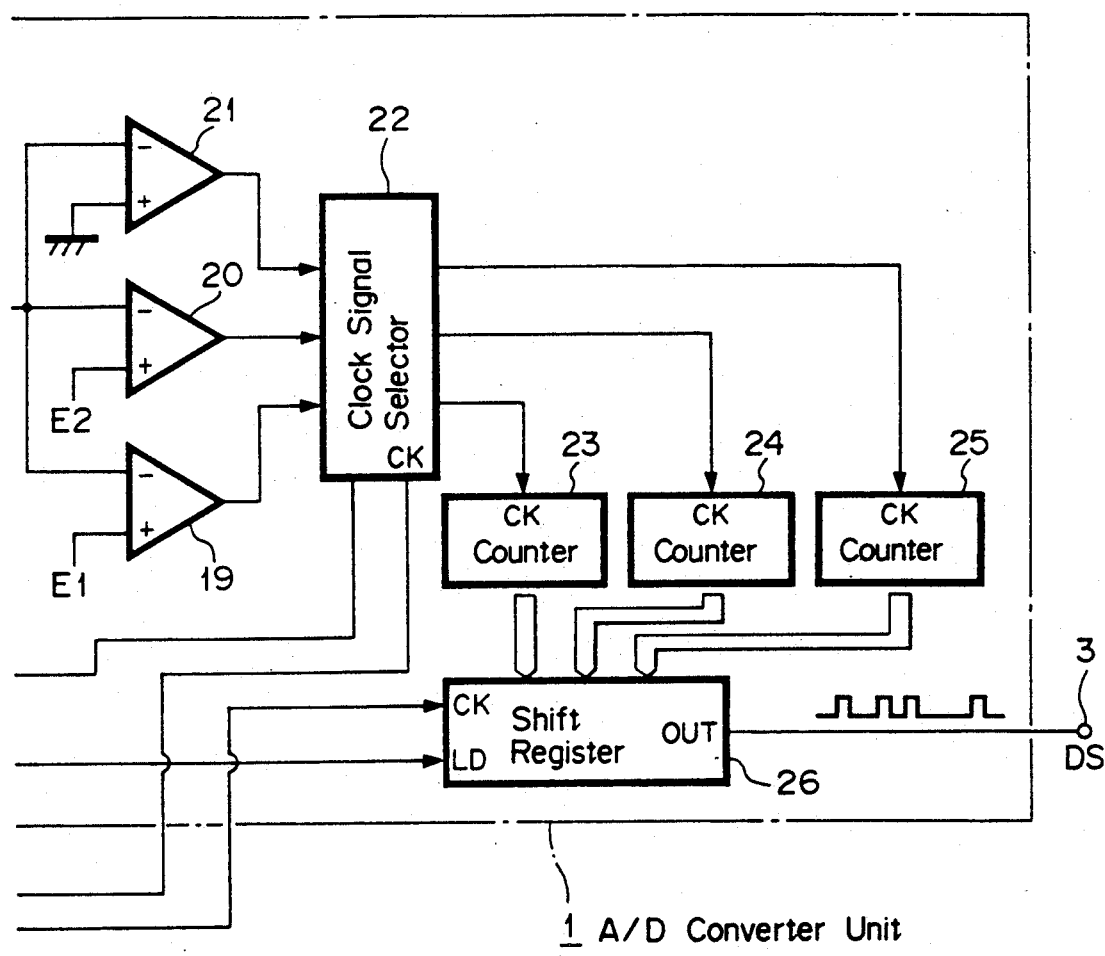

Those parts shown in FIGS. 3A and 3B which are identical to those in FIGS. 1A and 1B are designated by identical reference numerals and will not be described in detail below.

The A/D converter shown in FIGS. 3A and 3B additionally has a frequency divider 30 having a frequency division ratio of 1/100, an AND gate 31, and a counter 32 with a limit signal output terminal OUT. The counter 32 produces, from the limit signal output terminal OUT, a limit signal which is of a high level of "1" when the count of the counter 32 is 96 or lower, and of a low level of "0" when the count exceeds 96.

The input terminal 7 is supplied with a system clock signal SCK (see FIG. 2A) having a frequency of 12 MHz (more accurately, 12.288 MHz) from a data processor (not shown). The system clock signal SCK is supplied to the input terminal of the frequency divider 30, one input terminal of the AND gate 31, and the clock terminal CK of the counter 32. The clock signal whose frequency has been divided into 1/100 by the frequency divider 30 is supplied through the frequency divider 8 to the frequency divider 9 and the buffer 10B. The output signal from the frequency divider 9 is supplied to the clear terminal CL of the counter 32 and the buffer 10C. The limit signal from the counter 32 is supplied to the other input terminal of the AND gate 31, whose output signal is supplied to the buffer 10A.

The output signals from the buffers 10A, 10B, 10C serve respectively as an integrating clock signal MCK (see FIG. 4D) having burst pulses of a frequency of 12 MHz, an output clock signal BCK (see FIG. 4C) having a frequency of about 20 kHz, and an integration start signal WCK (see FIG. 4B) having a frequency of 640 Hz. These clock signals are supplied through the terminals 4, 5, 6 to the A/D converter unit 1. The A/D converter unit 1 and the manner in which the buffers 10A, 10B, 10C are connected to the A/D converter 1 in FIGS. 3A and 3B are the same as with the A/D converter shown in FIGS. 1A and 1B, and therefore will not be described in detail below.

Operation of the A/D converter shown in FIGS. 3A and 3B will now be described below with reference to FIGS. 4A through 4E. The A/D converter shown in FIGS. 3A and 3B serves to convert an analog input signal VI into a 15-bit serial digital signal DS with a sampling frequency of 640 Hz. The count of the counter 32 is cleared by a positive-going edge of the integration start signal WCK having a period T4 (1/T4=640 Hz). The limit signal from the counter 32 is of "1" during a period T6 after the count is cleared and until all of 96 pulses of the system clock signal SCK are supplied to the clock terminal CK. As shown in FIG. 4D, the integrating clock signal MCK comprises a burst of successive 96 count pulses having a frequency of 12 MHz only in each period T6. The count pulse bursts of the integrating clock signal MCK are periodically generated at a frequency of 640 Hz.

The A/D converter unit 1 operates in the same manner as the A/D converter unit 1 shown in FIGS. 1A and 1B. While the integration start signal WCK is of a low level of "0", the input signal VI is sampled. When the integration start signal WCK is of a high level of "1", the input signal VI is converted into a digital signal. Since the capacitance of the integrating capacitor 15 is the same as that of the integrating capacitor 15 shown in FIGS. 1A and 1B, the analog-to-digital conversion is completed within the period T6 after a positive-going edge of the signal WCK. As shown in FIG. 4E where the period T6 is shown at an enlarged scale, the counters 23, 24, 25 count the pulses of the integrating clock signal MCK in the interval T1 in which the converted output signal VC from the differential amplifier 14 is lower than the level E1, in the interval T2 in which the converted output signal VC is of a level between the levels E1, E2, and in the interval T3 in which the converted output signal VC is of a level between the levels E2, 0. When the converted output signal VC reaches the level 0, the 15-bit converted data are established. Because the capacitance of the capacitor 15 is the same as that shown in FIGS. 1A and 1B, the integrator composed of the differential amplifier 14 and the capacitor 15 effects integrating operation highly stably without the danger of inducing a conversion error.

When the integration start signal WCK thereafter goes low, i.e., to the level "0", the 15-bit converted data are loaded into the shift register 26, which supplies the converted data as the digital signal DS to the output terminal 3 in synchronism with the output clock signal BCK having the frequency of 20 kHz. At the same time that the digital signal DS is outputted to the output terminal 3, the differential amplifier 14 samples the input signal VI in a next cycle.

The electric power consumption by the A/D converter shown in FIGS. 3A and 3B will be considered below. The A/D converter unit 1 in the form of an IC is supplied with the integrating clock signal MCK, which has the highest frequency of 12 MHz among all the signals involved and affects the electric power consumption, only in the period T6 in each period T4. Therefore, the electric energy consumed by the A/D converter unit 1 with respect to the integrating clock signal MCK is about T6/T4 compared with the electric energy consumed by the conventional A/D converter unit. Since $T6/T4=96/(100\cdot 6\cdot 32)=1/200$, the electric energy consumed by the A/D converter unit 1 shown in FIG. 3 is about 1/200 of the electric energy consumed by the A/D converter unit 1 shown in FIGS. 1A and 1B. Therefore, if the A/D converter shown in FIGS. 1A and 1B is used to convert the input signal with a frequency which is 1/N (N is an frequency, then the electric energy consumed by the A/D converter is reduced to about $\frac{1}{2}$N.

Though the frequency divider 30, the AND gate 31, and the counter 32, which are added to the A/D converter shown in FIGS. 3A and 3B, consume a certain amount of electric energy, it is negligibly small compared with the electric energy consumption by the entire A/D converter unit 1 since the buffers of the IC generally consume a major proportion of electric energy.

The A/D converter according to the present invention can convert analog signals into digital signals highly stably and accurately, and its electric power consumption is greatly reduced in substantial proportion to the conversion frequency used.

While the present invention has been described and shown as being applied to an integrated A/D converter, the principles of the present invention are also applicable to an integrated D/A converter.

With the present invention, as described above, the electric power consumption due to the integrating clock signal is reduced in intervals except the integrating periods for reference signals. Therefore, when the integrated converter operates at a frequency lower than the frequency designed originally therefor, the integrated conversion can integrate the input signal highly stably and reduce the electric power consumption during operation.

Although a certain preferred embodiment has been shown and described, it should be understood that many changes and modifications may be made therein without departing from the scope of the appended claims.

I claim as my invention:

1. An integrated converter comprising:
   input means for receiving an input signal;
   an integrated A/D converter means for converting said input signal to an output signal outputted from an output means of said A/D converter means in response to an integrating clock signal, an output clock signal, and an integration start signal, each of which is derived from a system clock signal, said converter means including:
   integrating means for integrating said input signal from said input means to provide an integrated input signal,
   a plurality of comparators, having their outputs connected to a clock signal selector for comparing said integrated input signal to a first source of reference signals,
   a second source of reference signals respectively supplied to said integrating means and controlled by said clock signal selector,
   a plurality of counters in circuit with said clock signal selector,
   and an output shift register connected to said counters and in circuit with said output means;
   wherein said integrating means integrates said reference signals under the control of said clock signal selector and in synchronism with said integration start signal;
   said plurality of counters counts pulses of said integrating clock until the integrated value of said integrating means reaches a value corresponding to said input signal, thereby to convert said input signal into said output signal based on the count of said plurality of counters; and
   said integrated converter further comprising a gate for gating said integrating clock pulses to supply the integrating clock pulses to said plurality of counters only during a predetermined period in synchronism with said integration start signal, so that said integrating clock pulses are supplied to said plurality of counters only during an integrating period for said second source of reference signals.

2. An integrated converter according to claim 1, wherein said gate comprises an AND gate having first and second input terminals, said first input terminal being supplied with said integrating clock pulses, further including a gate counter for applying a high-level signal to said second input terminal of the AND gate while the count of said gate counter is lower than a predetermined value.

3. An integrated converter according to claim 1, wherein said input signal is an analog signal and said output signal is a digital output signal, so that said converter is structurally adapted for use as an integrated analog-to-digital converter.

4. The integrated converter of claim 1 wherein said gate inhibits supplying said integrating clock pulses to said counting means outside of said predetermined period, so that electric power consumption due to the integrating clock pulses is reduced.

5. The integrated converter of claim 1 wherein said gate further includes means for reducing the frequency of said clock signal.

6. An integrated converter, comprising:

a system clock means for supplying a system clock pulse at a predetermined frequency;

an integrating clock signal derived form said system clock pulse for controlling a conversion of an input signal to a converted output signal and for providing integrating clock pulses to a converted signal counter for integrating reference signals provided to said converted signal counter, said converted signal counter counting said integrating clock pulses until the integrated value of the reference signals reaches a value corresponding to said input signal, thereby to convert said input signal into a converted signal based on the count of said converted signal counter;

an output clock signal for controlling the output from said converted signal counter to provide said converted output signal, an integration start signal derived from said system clock means for initiating conversion of said input signal through a control circuit, and for integrating said reference signals in synchronism with said integration start signal; and gate means for gating said integrating clock signal to supply said integrating clock signal to said converted signal counter only during a predetermined portion of a converting period initiated by said integration start signal and inhibiting providing said integrating clock signal to said converted signal counter during the remainder of said converting period.

7. The integrated converter as set forth in claim 6, wherein said gate means includes means for reducing the frequency of said system clock for said output clock signal and said integration start signal, and providing said system clock frequency as the frequency of said integrating clock signal, whereby said integrating clock signal, said integration start signal, and said output clock signal are all derived from said system clock.

* * * * *